United States Patent
Isobe et al.

(10) Patent No.: US 7,751,243 B2
(45) Date of Patent: Jul. 6, 2010

(54) SEMICONDUCTOR MEMORY DEVICE PROVIDED WITH MOS TRANSISTOR HAVING CHARGE ACCUMULATION LAYER AND CONTROL GATE AND DATA WRITE METHOD OF NAND FLASH MEMORY

(75) Inventors: Katsuaki Isobe, Yokohama (JP); Noboru Shibata, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 95 days.

(21) Appl. No.: 12/208,798

(22) Filed: Sep. 11, 2008

(65) Prior Publication Data

US 2009/0067245 A1    Mar. 12, 2009

(30) Foreign Application Priority Data

Sep. 12, 2007   (JP)   ............................. 2007-236861

(51) Int. Cl.
   *G11C 11/34* (2006.01)
(52) U.S. Cl. ........................... 365/185.12; 365/185.17; 365/230.06; 365/185.33
(58) Field of Classification Search ............ 365/185.12, 365/185.17, 185.18, 230.06, 185.03, 185.11, 365/185.33
See application file for complete search history.

(56) References Cited

U.S. PATENT DOCUMENTS 7,161,833 B2   1/2007  Hemink
7,349,257 B2 *  3/2008  Lee et al. ............... 365/185.12

2008/0043528 A1   2/2008  Isobe et al.

FOREIGN PATENT DOCUMENTS

| JP | 10-283788 | 10/1998 |
|----|-----------|---------|
| JP | 11-284153 | 10/1999 |
| JP | 2002-245785 | 8/2002 |
| JP | 2006-522428 | 9/2006 |
| JP | 2007-506207 | 3/2007 |

* cited by examiner

*Primary Examiner*—David Lam
(74) *Attorney, Agent, or Firm*—Oblon, Spivak, McClelland, Maier & Neustadt, L.L.P.

(57) ABSTRACT

A semiconductor memory device includes a memory cell group, a selection transistor, a page buffer, and a row decoder. The memory cell group includes memory cell transistors connected in series. The selection transistor is connected to the memory cell transistor. The page buffer is adopted to apply first and second voltages to the bit lines connected to the memory cell transistors in which the "0" data and "1" data is to be programmed respectively, when the selection transistor is turned on, in a write operation. The page buffer is adopted to put the bit line into electrically floating after the first voltage and the second voltage are applied. The row decoder is adopted to apply a third voltage to a semiconductor layer on which the memory cell transistors are formed, and apply a program voltage to the selected word line when the bit line is in the electrically floating.

16 Claims, 13 Drawing Sheets

NAND flash memory

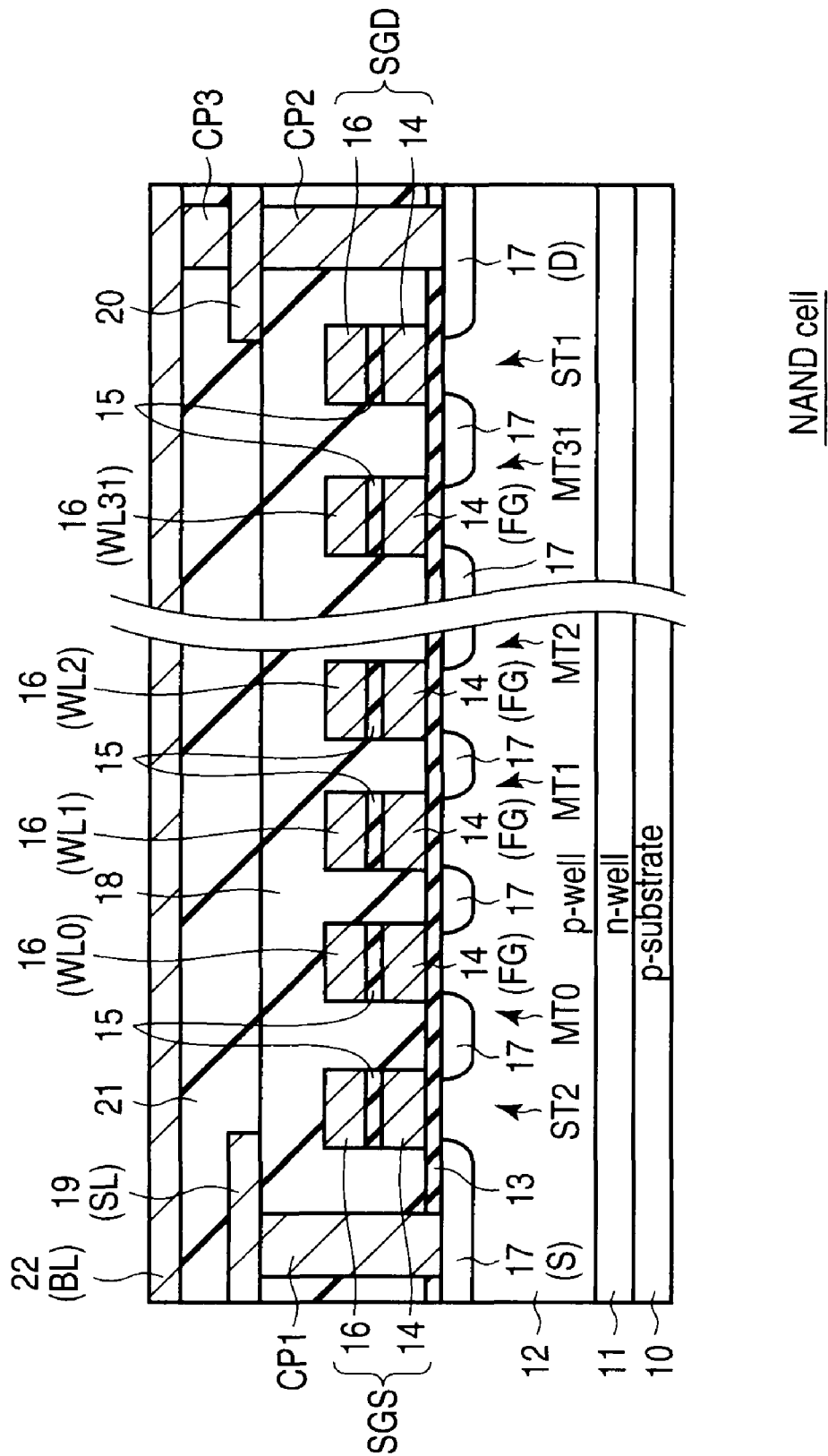
F I G. 3

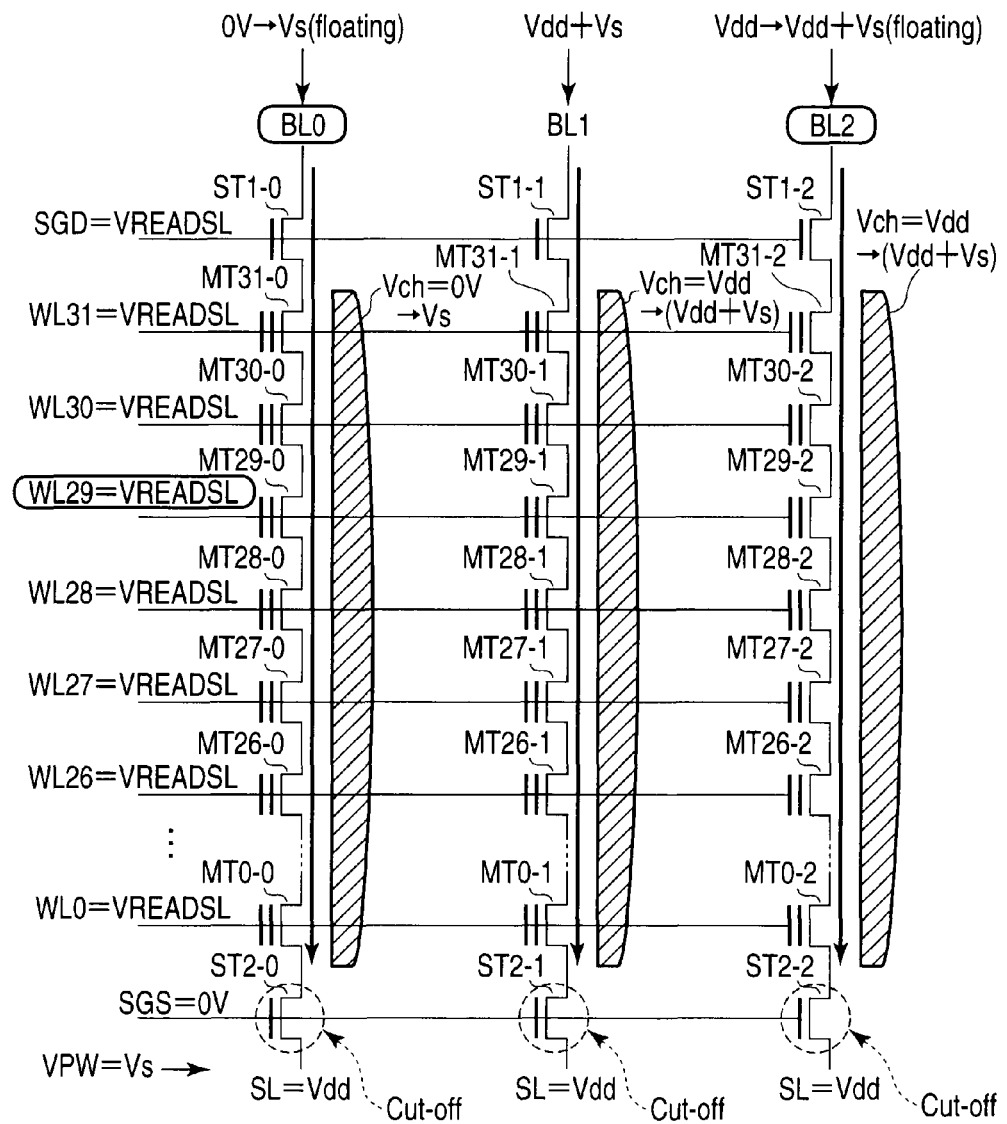
F I G. 13

SEMICONDUCTOR MEMORY DEVICE PROVIDED WITH MOS TRANSISTOR HAVING CHARGE ACCUMULATION LAYER AND CONTROL GATE AND DATA WRITE METHOD OF NAND FLASH MEMORY

CROSS-REFERENCE TO RELATED APPLICATIONS

This application is based upon and claims the benefit of priority from prior Japanese Patent Application No. 2007-236861, filed Sep. 12, 2007, the entire contents of which are incorporated herein by reference.

BACKGROUND OF THE INVENTION

1. Field of the Invention

The present invention relates to a semiconductor memory device provided with a MOS transistor having a charge accumulation layer and a control gate and a data write method of NAND flash memory, for example, a method for preventing erroneous write of the NAND flash memory.

2. Description of the Related Art

Conventionally, the NAND flash memory is well known as a nonvolatile semiconductor memory. A self-boost technique is widely used in the NAND flash memory. In the self-boost technique, a channel potential in write inhibit cell is increased by coupling to a gate, thereby preventing injection of electrons into a floating gate.

In the self-boost technique, it is known that boost efficiency is lowered by use of a memory cell in which data is written to increase a threshold. Therefore, there has been proposed a technique in which a channel of a memory cell on a source line side from a selected memory cell is cut off, thereby improving the boost efficiency with only an erased cell. For example, Jpn. Pat. Appln. KOKAI Publication No. 10-283788 discloses the technique.

However, in the technique disclosed in Jpn. Pat. Appln. KOKAI Publication No. 10-283788, the channel cannot be cut off depending on the threshold voltage of the memory cell, lowering the boost efficiency. As a result, there is generated a problem in that the data is erroneously written to the write inhibit cell.

Recently, a multi-level technique is actively developed in the NAND flash memory. In the multi-level NAND flash memory, a threshold voltage range of each data is narrowed. As a result, a retention margin of the memory cell is decreased. In order to solve the problem, it can be considered that the threshold voltage of the memory cell is expanded toward a high-voltage side or a low-voltage side as a whole. However, when the threshold voltage is expanded toward the high-voltage side, it is necessary to increase a write voltage and a read voltage, which easily causes the erroneous write and erroneous read. When the threshold voltage is expanded toward the low-voltage side, the problem that the channel cannot be cut off in performing the self-boost becomes prominent.

BRIEF SUMMARY OF THE INVENTION

A semiconductor memory device according to an aspect of the present invention includes:

memory cell transistors which are formed on a semiconductor layer, each of the memory cell transistors having a stacked gate including a charge accumulation layer and a control gate, the memory cell transistors being capable of retaining "0" data or "1" data based on whether or not a charge is injected into the charge accumulation layer;

a memory cell group in which current passages of the memory cell transistors are connected in series;

a selection transistor which has a current passage connected in series to one of the memory cell transistors located closest to a drain side in the memory cell group;

a memory cell array in which the memory cell group and the selection transistor are arranged;

a bit line which is connected to a drain of the memory cell transistor through the current passage of the selection transistor;

a page buffer which is adopted to apply a first voltage to the bit line connected to the memory cell transistor in which the "0" data is to be programmed and apply a second voltage larger than the first voltage to the bit line connected to the memory cell transistor in which the "1" data is to be programmed, when the selection transistor is turned on, in a write operation of the data, the page buffer being adopted to put the bit line into electrically floating state after the first voltage and the second voltage are applied;

a word line which is connected to the control gate of the memory cell transistor; and a row decoder which is adopted to apply a positive third voltage to the semiconductor layer, select the word line connected to the memory cell transistor to be programmed, and apply a program voltage to the selected word line when the bit line is in the electrically floating state.

A data write method a NAND flash memory according to an aspect of the present invention includes:

applying a first voltage to a first bit line connected to a memory cell transistor in which "0" data is to be programmed when a selection transistor is turned on;

applying a second voltage larger than the first voltage to a second bit line connected to a memory cell transistor in which "1" data is to be programmed when the selection transistor is turned on;

putting the first bit line and the second bit line into electrically floating state after the first voltage and the second voltage are applied;

increasing a potential at a semiconductor layer by applying a third voltage to the semiconductor layer on which the memory cell transistor is formed after the first voltage and the second voltage are applied; and programming data to the memory cell transistor by selecting a word line and applying a program voltage to the selected word line in a state that potentials at the first bit line and the second bit line are put into floating and a potential at the semiconductor layer is increased.

BRIEF DESCRIPTION OF THE SEVERAL VIEWS OF THE DRAWING

FIG. 3 is a sectional view showing a memory cell array of the first embodiment;

FIG. 13 is a circuit diagram showing a memory cell array of the second embodiment;

DETAILED DESCRIPTION OF THE INVENTION

First Embodiment

Figure 1:
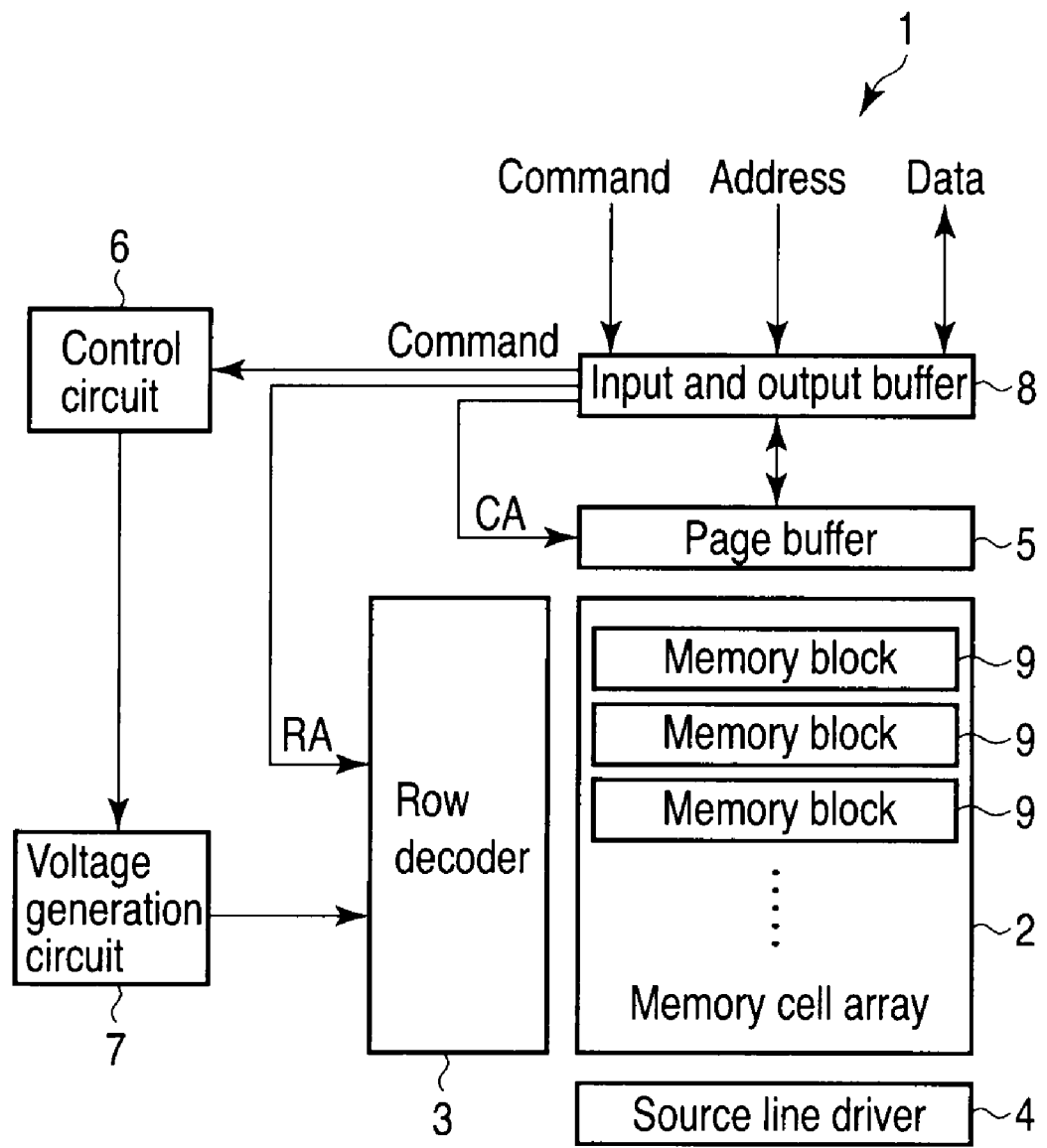
FIG. 1 is a block diagram showing a flash memory according to a first embodiment of the invention.

A semiconductor memory device and a data write method thereof according to a first embodiment of the invention will be described with reference to FIG. 1. FIG. 1 is a block diagram showing a NAND flash memory of the first embodiment. As shown in FIG. 1, a NAND flash memory 1 includes a memory cell array 2, a row decoder 3, a source line driver 4, a page buffer 5, a control circuit 6, a voltage generation circuit 7, and an input and output buffer 8.

The memory cell array 2 includes plural memory blocks 9. Each memory block 9 includes plural memory cell transistors. In each memory cell transistor, a gate is connected to a word line, a drain is electrically connected to a bit line, and a source is electrically connected to a source line. Data of the flash memory 1 is erased in units of memory block 9. That is, the data retained by the memory cell transistors included in the same memory block 9 are collectively erased.

The input and output buffer 8 receives command data, address data, and write data, and the input and output buffer 8 supplies data read from the memory cell array 2 to the outside.

The row decoder 3 selects a row direction of the memory cell array 2 according to a row address signal RA supplied from the input and output buffer 8. That is, the row decoder 3 selects the word line.

The source line driver 4 applies a voltage to the source line.

The page buffer 5 includes a sense amplifier. In reading the data, the page buffer 5 senses and amplifies the data read from the memory cell transistor. In writing the data, the page buffer 5 retains the write data to apply a voltage to the bit line according to the write data.

The voltage generation circuit 7 generates a voltage in response to a command of the control circuit 6. The voltage generated by the voltage generation circuit 7 is applied to the row decoder 3, the source line driver 4, and the page buffer 5.

The control circuit 6 executes a write sequence in response to a command supplied from the input and output buffer 8 in writing the data, and the control circuit 6 controls an operation of the voltage generation circuit 8.

Figure 2:
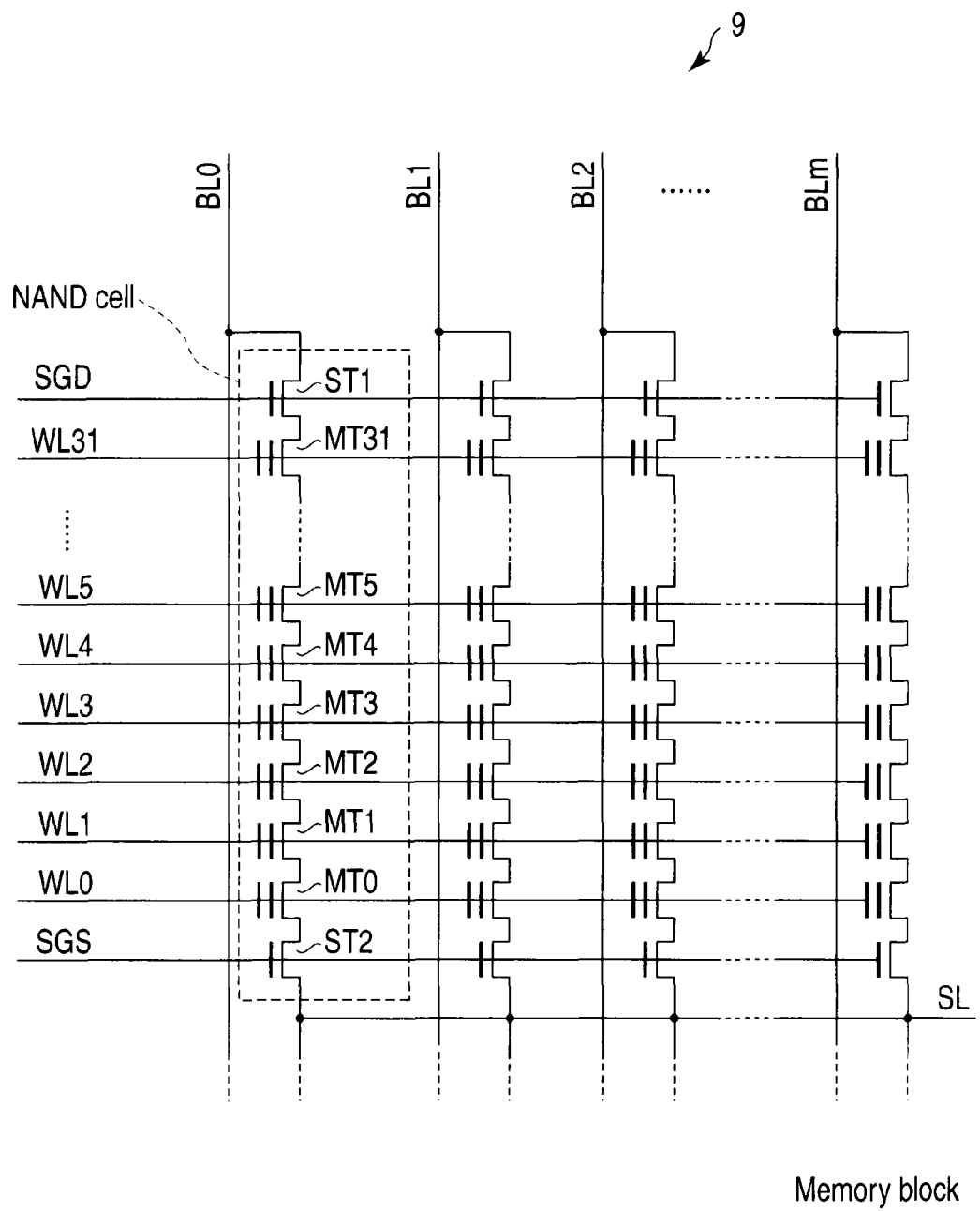
FIG. 2 is a circuit diagram showing a memory cell array of the first embodiment.

The memory block 9 included in the memory cell array 2 will be described in detail with reference to FIG. 2. FIG. 2 is a circuit diagram of the memory block 9.

As shown in FIG. 2, the memory block 9 includes plural NAND cells. Each of the NAND cell includes 32 memory cell transistors MT0 to MT31 and selection transistors ST1 and ST2. In the following description, for the sake of convenience, sometimes the memory cell transistors MT0 to MT31 are simply referred to as memory cell transistor MT when not distinguished from one another. The memory cell transistor MT has a stacked gate structure including a charge accumulation layer (for example, floating gate) and a control gate. The charge accumulation layer is formed on a semiconductor substrate with a gate insulating film interposed therebetween. The control gate is formed on the charge accumulation layer with an inter-gate insulating film interposed therebetween. The number of memory cell transistors MT is not limited to 32, but 8 or 16 memory cell transistors MT may be used in the NAND cell. The source and the drain are shared by the memory cell transistors MT adjacent to each other. Selection transistors ST1 and ST2 are disposed such that current passages of the memory cell transistors MT are connected in series. The drain on one end side of the series connected memory cell transistor MT is connected to the source of the selection transistor ST1, and the source on the other end side is connected to the drain of the selection transistor ST2. That is, the NAND cell includes the memory cell group having the selection transistors ST1 and ST2 and the plural memory cell transistors MT connected in series between the selection transistors ST1 and ST2.

The control gates of the memory cell transistors MT located in the same row are commonly connected to one of word lines WL0 to WL31. The gates of the selection transistors ST1 and ST2 of the memory cells, located in the same row, are commonly connected to select gate lines SGD and SGS, respectively. In the memory cell array 2, the drains of the selection transistors ST1 located in the same column are commonly connected to one of bit lines BL0 to BLm (m is a natural number). The sources of the selection transistors ST2 are commonly connected to a source line SL. It is not always necessary to provide both the selection transistors ST1 and ST2, but only one of the selection transistors ST1 and ST2 may be provided as long as the NAND cell can be selected.

In the memory cell array 2, the data is collectively written to the plural memory cell transistors MT connected to the same word line WL. A unit in which the data is written is referred to as "page". In the first embodiment, in the (m+1) memory cell transistors MT connected to the same word line, the data is collectively written to each of the memory cell transistors MT connected to even bit lines (BL0, BL2, BL4, . . . ) and in each of the memory cell transistors MT connected to odd bit lines (BL1, BL3, BL5, . . . ). Similarly to the data write, the data is read in the same unit.

A sectional structure of the NAND cell will be described with reference to FIG. 3. FIG. 3 is a sectional view showing the NAND cell along a bit-line direction. As shown in FIG. 3, an n-type well region 11 is formed in a surface area of a p-type semiconductor substrate 10, and a p-type well region 12 is formed in a surface area of the well region 11. A gate insulating film 13 is formed on the well region 12, and gate electrodes of the memory cell transistor MT and selection transistors ST1 and ST2 are formed on the gate insulating film 13. Each gate electrode includes a polycrystalline silicon layer 14 formed on the gate insulating film 13, an inter-gate insulating film 15 formed on the polycrystalline silicon layer 14, and a polycrystalline silicon layer 16 formed on the inter-gate insulating film 15. The inter-gate insulating film 15 is formed by a silicon oxide film, an ON film, an NO film, or an ONO film. The ON film, the NO film, or the ONO film is a multilayer structure of the silicon oxide film and a silicon nitride film.

In the memory cell transistor MT, the polycrystalline silicon layer 14 functions as a charge accumulation layer (FG). On the other hand, the polycrystalline silicon layers 16 which are adjacent in a direction orthogonal to the bit line are commonly connected, and the polycrystalline silicon layer 16 functions as control gate (word line WL). In the selection transistors ST1 and ST2, the polycrystalline silicon layers 14 and 16 which are adjacent in a word-line direction are commonly connected. The polycrystalline silicon layers 14 and 16 function as the select gate lines SGS and SGD. Alternatively, only the polycrystalline silicon layer 14 may function as the select gate line. In such cases, potentials at the polycrystalline silicon layers 16 in the selection transistors ST1 and ST2 are kept constant or put into a floating state. An $n^+$-type impurity diffusion layer 17 is formed in a surface of the well region 12 located between the gate electrodes. The impurity diffusion layer 17 is shared by the transistors adjacent to each other, and the impurity diffusion layer 17 functions as a source (S) or a drain (D).

An interlayer insulating film 18 is formed on the well region 12 such that the memory cell transistor MT and the selection transistors ST1 and ST2 are coated therewith. A contact plug CP1 is formed in the interlayer insulating film 18 so as to reach the impurity diffusion layer (source) 17 of the selection transistor ST2 on the source side. A metal interconnection layer 19 connected to the contact plug CP1 is formed on the interlayer insulating film 18. The metal interconnection layer 19 functions as a source line SL. A contact plug CP2 is also formed in the interlayer insulating film 18 so as to reach the impurity diffusion layer (drain) 17 of the selection transistor ST1 on the drain side. A metal interconnection layer 20 connected to the contact plug CP2 is formed on the interlayer insulating film 18.

An interlayer insulating film 21 is formed on the interlayer insulating film 18 such that metal interconnection layers 19 and 20 are coated therewith. A contact plug CP3 is formed in the interlayer insulating film 21 so as to reach the metal interconnection layer 20. A metal interconnection layer 22 commonly connected to the plural contact plugs CP3 is formed on the interlayer insulating film 21. The metal interconnection layer 22 functions as a bit line BL.

Figure 4:
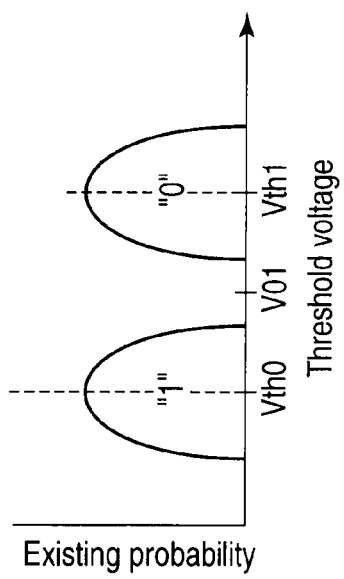
FIGS. 4 and 5 are graphs showing a threshold distribution of the memory cell of the first embodiment.

A threshold distribution of the memory cell transistor MT will be described with reference to FIG. 4. FIG. 4 shows a graph in which a threshold voltage Vth is set at a horizontal axis while an existing probability of the memory cell transistor MT is set at a vertical axis.

As shown in FIG. 4, each memory cell transistor MT can retain binary (two-level 2) data (one-bit data). That is, the memory cell transistor MT is capable of retaining two kinds of data "1" and "0" in the ascending order of the threshold voltage Vth.

In the memory cell transistor MT, a threshold voltage Vth0 of the "1" data has a range of Vth0<V01, and a threshold voltage Vth1 of the "0" data has a range of V01<Vth1. Thus, the memory cell transistor MT can retain the one-bit data of the "0" data and "1" data according to the threshold voltage. The threshold voltage fluctuates by injecting charges into the charge accumulation layer.

Figure 5:
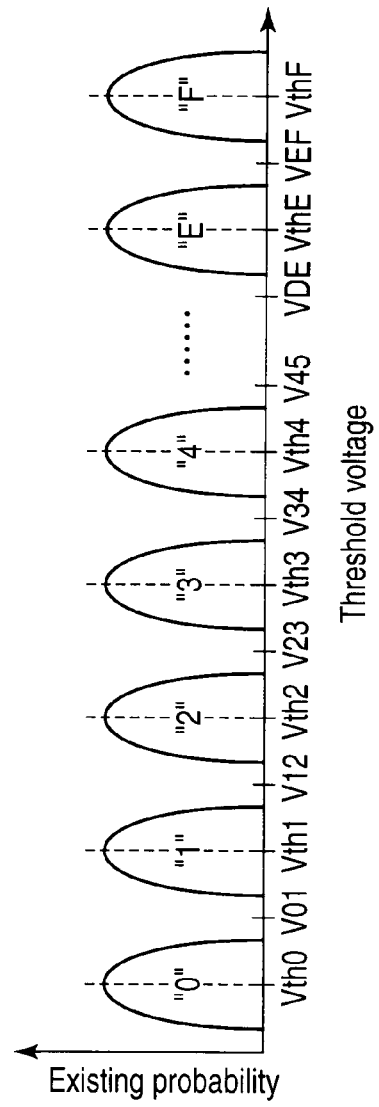

The memory cell transistor MT can retain data having at least four values. The threshold distribution in this case will be described with reference to FIG. 5. FIG. 5 shows a graph in which the threshold voltage Vth is set at the horizontal axis while the existing probability of the memory cell transistor MT is set at the vertical axis.

As shown in FIG. 5, each memory cell transistor MT may be capable of retaining 16-levels data (four-bit data). That is, the memory cell transistor MT can retain 16 kinds of data "0", "1", "2", "3", ... "9", "A", "B", ... "F" in the ascending order of the threshold voltage Vth. In the memory cell transistor MT, the threshold voltage Vth0 of the "0" data has a range of Vth0<V01. The threshold voltage Vth1 of "1" data has a range of V01<Vth1<V12. A threshold voltage Vth2 of the "2" data has a range of V12<Vth2<V23. A threshold voltage Vth3 of the "3" data has a range of V23<Vth3<V34. A threshold voltage Vth4 of the "4" data has a range of V34<Vth4<V45. A threshold voltage Vth5 of the "5" data has a range of V45<Vth5<V56. A threshold voltage Vth6 of the "6" data has a range of V56<Vth6<V67. A threshold voltage Vth7 of the "7" data has a range of V67<Vth7<V78. A threshold voltage Vth8 of the "8" data has a range of V78<Vth8<V89. A threshold voltage Vth9 of the "9" data has a range of V89<Vth9<V9A. A threshold voltage VthA of the "A" data has a range of V9A<VthA<VAB. A threshold voltage VthB of the "B" data has a range of VAB<VthB<VBC. A threshold voltage VthC of the "C" data has a range of VBC<VthC<VCD. A threshold voltage VthD of the "D" data has a range of VCD<VthD<VDE. A threshold voltage VthE of the "E" data has a range of VDE<VthE<VEF. A threshold voltage VthF of the "F" data has a range of VEF<VthF.

As shown in FIG. 5, the data is written bit by bit in the case where the memory cell transistor MT retains the data having plural bits. That is, for example, in the case where the memory cell transistor MT retains three-bit data, a program operation of the "0" data or "1" data is performed three times to perform the write operation.

In the following description, the case in which the charges are injected into the charge accumulation layer to raise the threshold voltage is referred to as "0" program irrespective of the case in which the memory cell transistor MT retains the binary data or the multi-bit data. On the other hand, the case in which the charges are not injected into the charge accumulation layer (in other words, the charge injection is restricted to an extent in which the retention data does not make a transition to another level) nor is changed the threshold voltage is referred to as "1" program.

Figure 6:
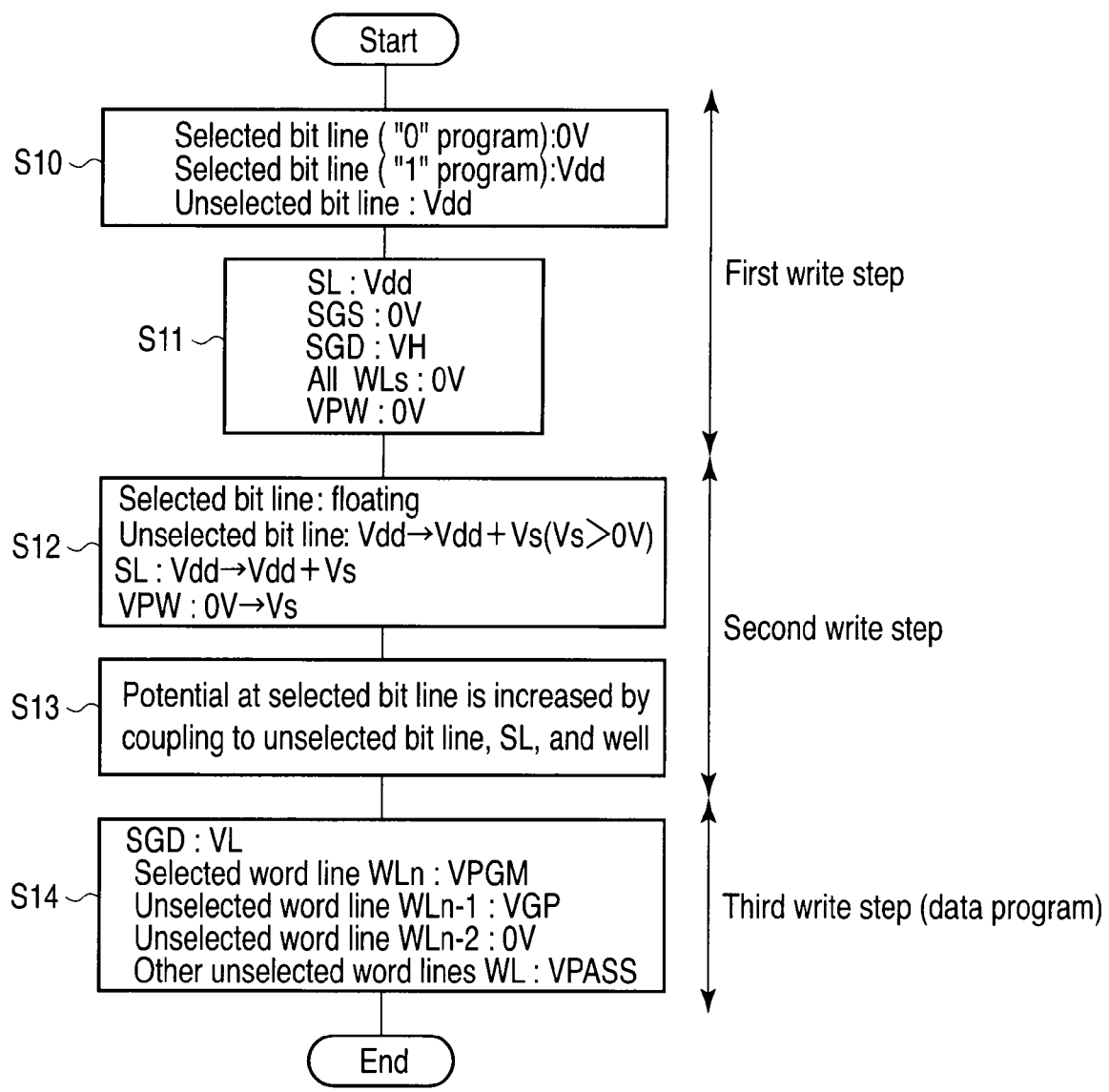
FIG. 6 is a flowchart showing a write operation of the first embodiment.
Figure 7:
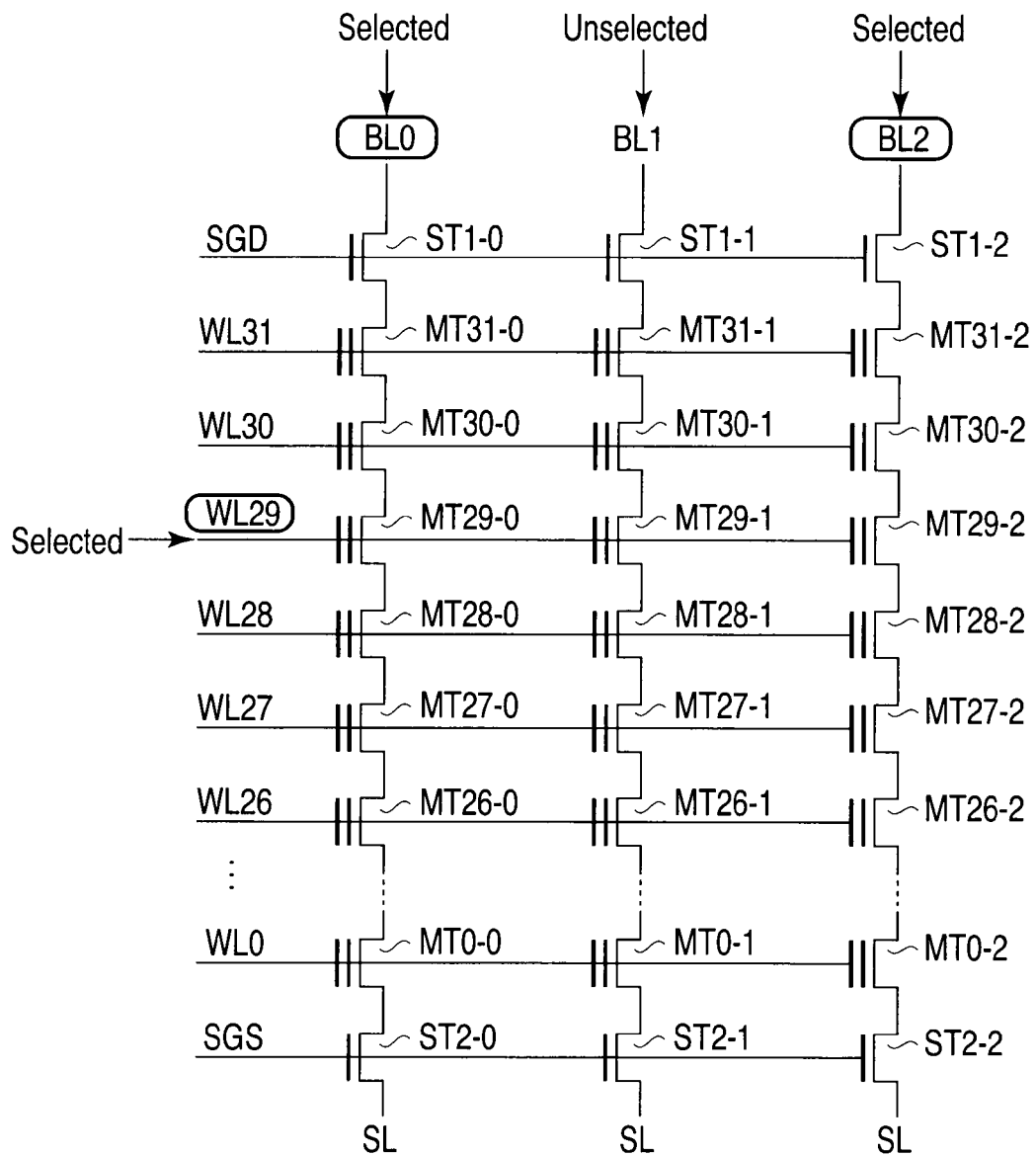
FIGS. 7 to 10 are circuit diagrams showing the memory cell array of the first embodiment.

The write operation of the NAND flash memory will be described with reference to FIG. 6. FIG. 6 is a flowchart showing the write operation. The write sequence along the flowchart is executed by the control circuit 6 which receives a write command from the outside.

As described above, the data write is performed in units of even bit line or units of odd bit line. Hereinafter, in the even bit line and the odd bit line, the bit line which becomes a data write target is referred to as selected bit line, and the bit line which does not become a data write target is referred to as unselected bit line. The word line connected to the memory cell transistor in which the data should be written is referred to as selected word line, and other word lines are referred to as unselected word line. The data write is sequentially performed from the memory cell transistor located closer to the select gate line SGS.

The data write operation is roughly divided into a first write step, a second write step, and a third write step. In the first write step, a voltage is transferred to a channel of the memory cell transistor located closer to the drain side than the selected word line (closer to the selection transistor ST1). In the second write step, the selected bit line is put into floating, and a potential at the unselected bit line is increased by coupling. In the third write step, a program voltage is applied to the selected word line while the potential at unselected bit line is increased, thereby performing the data program. The data write operation will be described in detail with reference to the drawing.

As shown in FIG. 6, the first write step is performed. The page buffer 5 applies a write voltage (for example, 0V) to the selected bit line connected to the memory cell transistor in which the "0" program is executed. The page buffer 5 applies a write inhibit voltage (for example, Vdd=3V) to the selected bit line connected to the memory cell transistor in which the "1" program is executed (Step S10) and unselected bit line.

The source line driver 4 applies a voltage Vdd to the source line. The row decoder 3 applies a voltage of 0V to the select gate line SGS, applies a voltage VH to the select gate line SGD, applies the voltage of 0V to all the word lines WL, and applies the voltage of 0V to the well region 12 (potential at the p-type well region 12 is designated by VPW) (Step S11). The voltage VH enables the selection transistor ST1 to pass the voltage Vdd and the sum (Vdd+Vs) of the voltage Vdd and a voltage Vs. The voltages Vdd and VH are generated by the voltage generation circuit 7 under the control of the control circuit 6.

The voltages VH and 0V are respectively applied to the select gate lines SGS and SGD, whereby the selection transistor ST1 turned on while the selection transistor ST2 is cut off. The voltage of 0V is applied to all the word lines WL, thereby turning on the memory cell transistors MT, which are connected to at least the selected word line and the unselected word line located closer to the drain side than the selected word line. Other memory cell transistors MT are turned on or off according to the retention data. As a result, the channels are formed in the memory cell transistors MT connected to at least the selected word line and the unselected word line located closer to the drain side than the selected word line, and the potential at the corresponding bit line is transferred to the channel.

Then, the second write step is performed. The page buffer 5 puts the selected bit line into the electrically floating state. The page buffer 5 applies the voltage (Vdd+Vs) to the unselected bit line. The source line driver 4 applies the voltage (Vdd+Vs) to the source line, and the row decoder 3 applies the voltage Vs to the well region 12 (Step S12). The voltage Vs is a positive voltage which is generated by the voltage generation circuit 7.

As a result of Step S12, the potential at the selected bit line which is in the electrically floating state is increased by coupling to the unselected bit line, source line SL and the well region 12 (Step S13). That is, the potential at the selected bit line connected to the memory cell transistor in which the "0" program is executed is substantially increased from 0V to Vs. On the other hand, the potential at the selected bit line connected to the memory cell transistor in which the "1" program is executed is substantially increased from Vdd to (Vdd+Vs). At this point, the potential at the select gate line SGD is VH.

Then, the third write step is performed. The row decoder 3 applies a voltage VL to the select gate line SGD, applies a program voltage VPGM (for example, 20V) to the selected word line WLn (n is a natural number), applies an intermediate voltage VGP (for example, 3V+Vs) to the unselected word line WLn-1, applies the voltage of 0V to the unselected word line WLn-2, and applies a voltage VPASS to other unselected word lines WL (Step S14). The voltages VPGM, VGP, VPASS, and VL are generated by the voltage generation circuit 7 under the control of the control circuit 6. The voltage VL enables the selection transistor ST1 to pass the voltage Vs while inhibiting the selection transistor ST1 from passing the voltage (Vdd+Vs). That is, in the case where the bit line has the voltage (Vdd+Vs), the selection transistor ST1 is cut off. The voltage VPASS can turn on the memory cell transistor MT irrespective of the retention data.

Through Step S14, for the memory cell transistor MT in which the "0" program should be executed in the memory cell transistors MT connected to the selected word line and selected bit line, the potential at the gate becomes VPGM, the potential at the channel becomes Vs, and the charges are trapped by the charge accumulation layer 14. Accordingly, the threshold voltage of the memory cell transistor MT is raised to execute the "0" program.

On the other hand, for the memory cell transistor MT in which the "1" program should be executed, because the potential at the channel is increased by the coupling to the gate, the charges are not trapped by the charge accumulation layer 14 (are not trapped to an extent in which the "0" program is executed), and the "1" program is executed. That is, in the NAND cell including the memory cell transistor MT in which the "1" program should be executed, the selection transistors ST1 and ST2 are cut off, and the channel of the memory cell group located between the selection transistors ST1 and ST2 is put into electrically floating. At this point, because the voltage VPGM or VPASS is applied to the word line WL, the potential at the channel is increased by the coupling to the word line WL, and an electric field between the gate and the channel is relaxed. The same holds true for the memory cell transistor MT connected to the unselected bit line.

Figure 8:
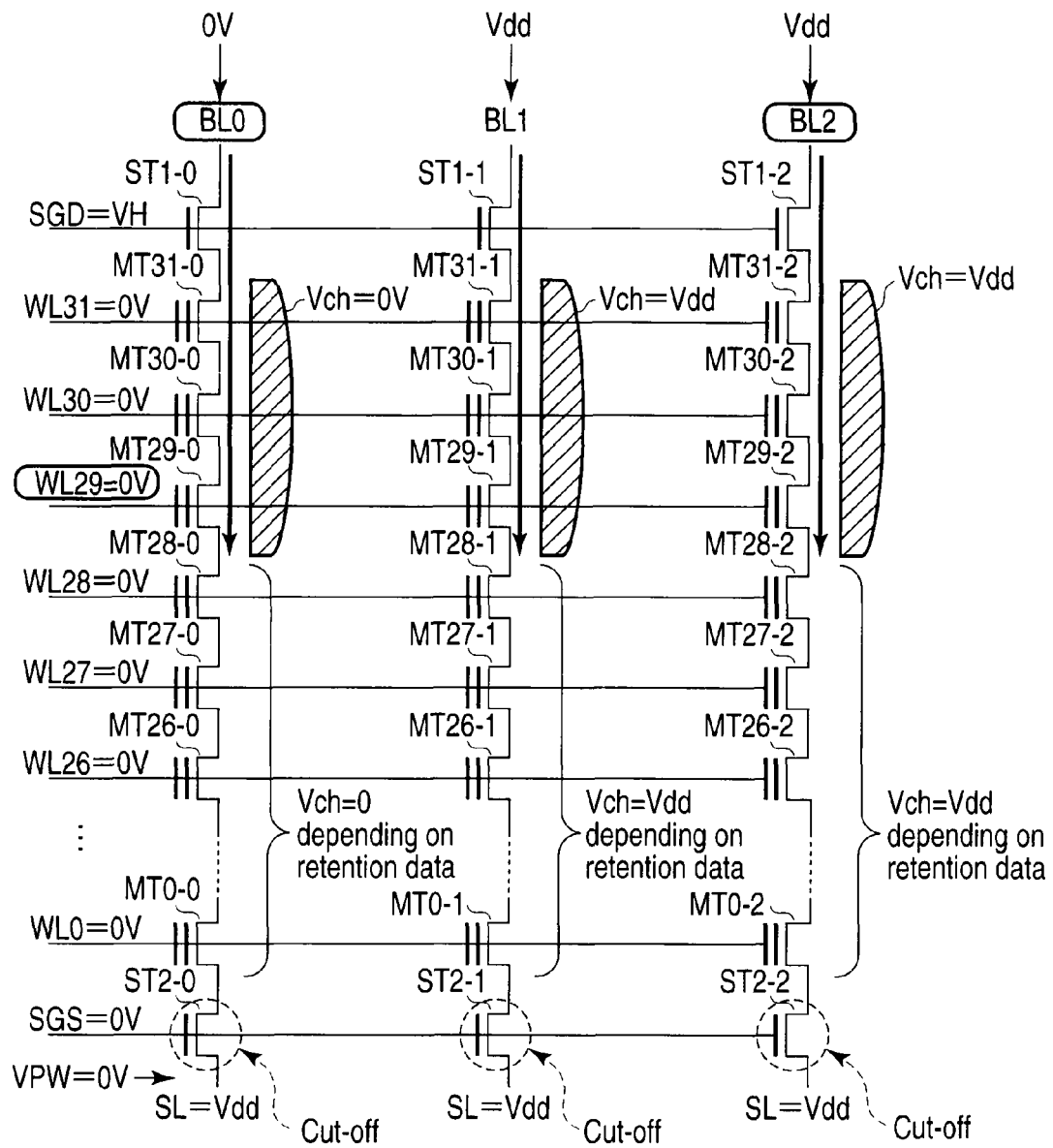
Figure 9:
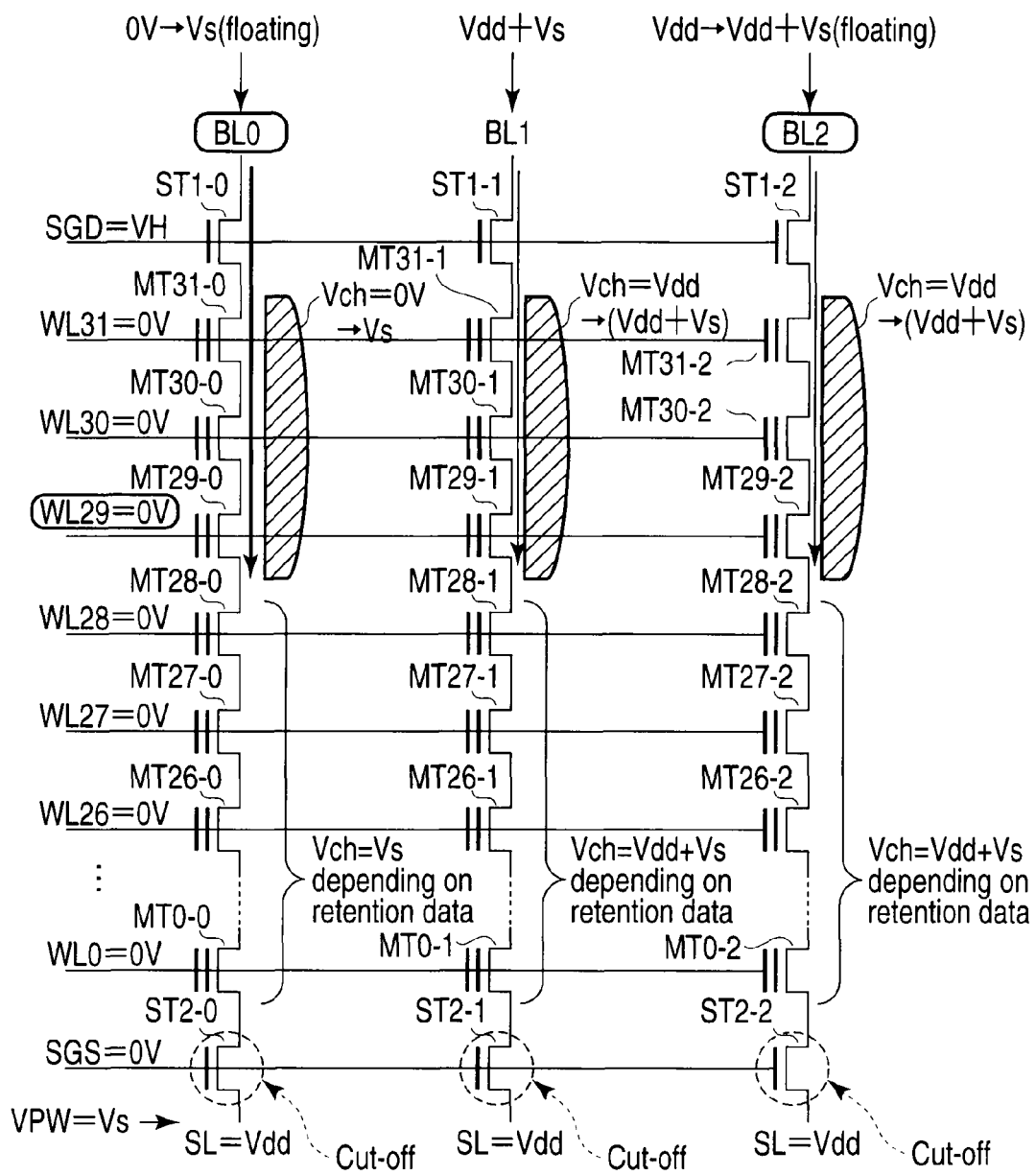
Figure 10:
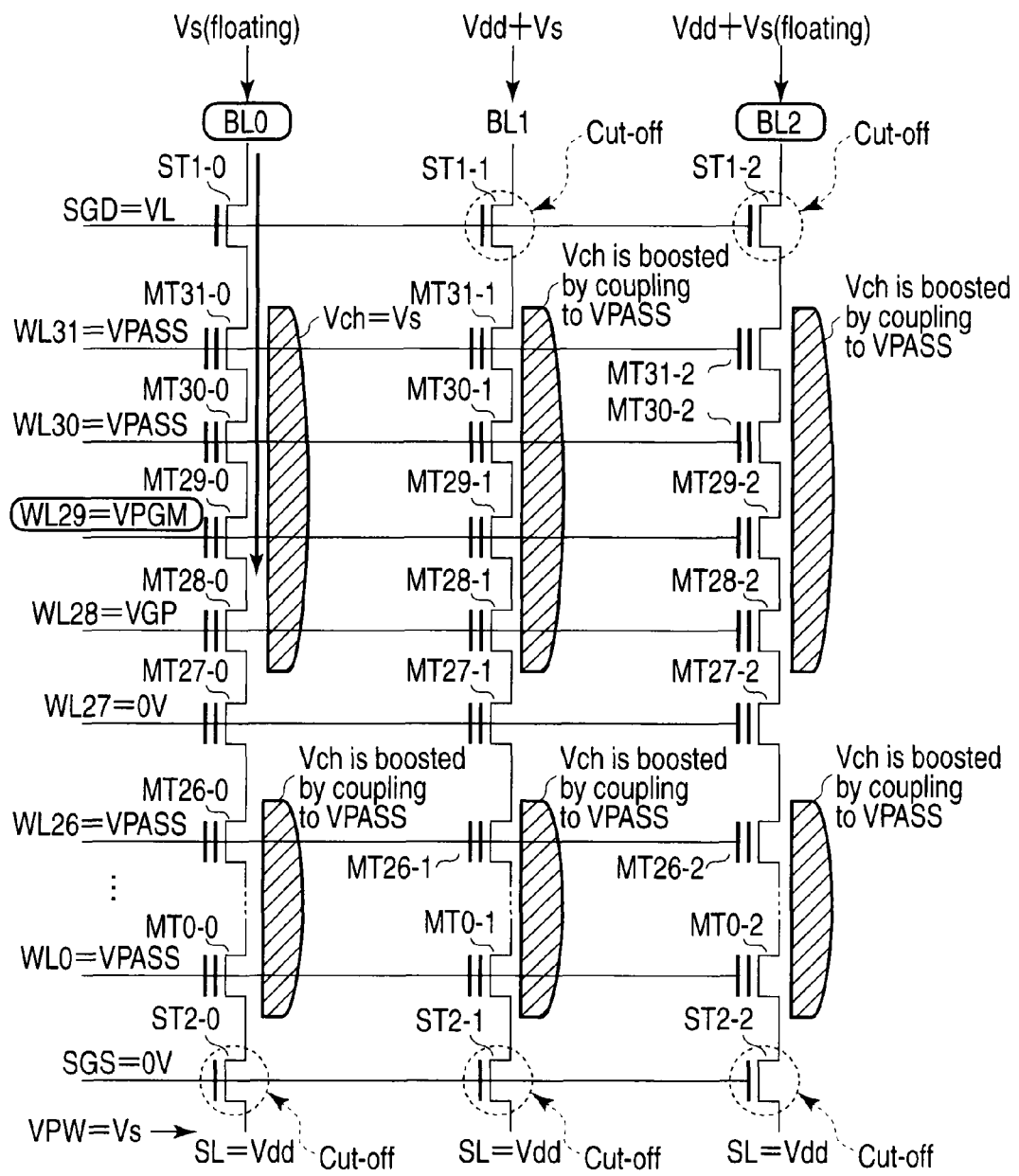

A specific example of the write operation will be described with reference to FIGS. 7 to 10. FIGS. 7 to 10 are circuit diagram of the memory block 9. For the sake of simple explanation, as shown in FIG. 10, the three bit lines BL (BL0 to BL2) will be described. It is assumed that the data is written to the memory cell transistor MT29 connected to the even bit lines BL0 and BL2 and word line WL29 (WLn=WL29) and the "0" program and "1" program are executed to the memory cell transistors MT29 connected to the bit lines BL0 and BL2, respectively. The selection transistor ST1 and ST2 and memory cell transistors MT0 to MT31, which are connected to the bit lines BL0 to BL2, are referred to selection transistor ST1-0 to ST1-2 and ST2-0 to ST2-2 and memory cell transistors MT0-0 to MT31-0, MT0-1 to MT31-1, and MT0-2 to MT31-2 as needed, respectively.

In the first write step, the processes in Steps S10 and S11 are performed. FIG. 8 shows the state of the processes in Steps S10 and S11. As shown in FIG. 8, a write voltage of 0V is applied to the selected bit line BL0, and a write inhibit voltage of Vdd is applied to the selected bit line BL2 and the unselected bit line BL1 (Step S10). The row decoder 3 respectively applies the voltages VH and 0V to the select gate lines SGD and SGS, and the row decoder 3 applies the voltage of 0V to all the word lines WL0 to WL31.

Therefore, the selection transistors ST1-0 to ST1-2 are turned on, and the selection transistors ST2-0 to ST2-2 are cut off. The memory cell transistors MT30 and MT31 connected to the word lines WL30 and WL31 located closer to the select gate line SGD than the memory cell transistor MT29 are in the erase state at the time the data is written to the memory cell transistor MT29. Accordingly, the memory cell transistors MT29 to MT31 are turned on to form the channel. That is, the conducting state is established from the bit line BL to the channel of at least the memory cell transistor MT29 through the selection transistor ST1. The conducting state is shown by a hatched area of FIG. 8. The channel potentials Vch at the memory cell transistors MT29-0 to 31-0 becomes 0V as well as the bit line BL0, and the channel potential Vch at the memory cell transistors MT29-1 to MT31-1 and MT29-2 to MT31-2 becomes Vdd as well as the bit lines BL1 and BL2.

At this point, because the data is already programmed in the memory cell transistors MT0 to MT28 connected to the word lines WL0 to WL28, the turned-on memory cell transistor MT also exists depending on the already-programmed data. When the conducting state is established between the turned-on memory cell transistor MT and the memory cell transistor MT29, the channel potential Vch at the turned-on memory cell transistor MT is also put into 0V or Vdd.

In the second write step, the processes in Steps S12 and S13 are performed. FIG. 9 shows the state of the processes in Steps S12 and S13. As shown in FIG. 9, the page buffer 5 puts the potentials at the selected bit lines BL0 and BL2 into floating at 0V and Vdd, respectively. The potentials at the unselected bit line BL1, the source line SL, and the well region 12 are increased by Vs.

As a result, the potentials at the selected bit lines BL0 and BL2 are increased from 0V to Vs and from Vdd to (Vdd+Vs) by the coupling, respectively. Because the voltage VH is applied to the select gate line SGD, the selection transistors ST1-0 to ST1-2 are maintained at the turn-on state.

Therefore, the potential at the bit line BL0 is transferred to the channels of the memory cell transistors MT29-0 to MT31-0, and the potentials Vch at the memory cell transistors MT29-0 to MT31-0 are increased from 0V to Vs. The potentials Vch at the memory cell transistors MT0-0 to MT28-0 also become Vch=Vs depending on the retention data.

The same holds true for the memory cell transistors MT29-1 to MT31-1 and MT29-2 to MT31-2. That is, the potentials at the bit lines BL1 and BL2 are transferred to the channels of the memory cell transistors MT29-1 to MT31-1 and MT29-2 to MT31-2, and the potentials Vch at the memory cell transistors MT29-1 to MT31-1 and MT29-2 to MT31-2 are increased from Vdd to (Vdd+Vs). At this point, for the memory cell transistors MT0 to MT28 connected to the word lines WL0 to WL28, the channel potentials Vch at the memory cell transistors MT0 to MT28 is increased by Vs depending on the already-programmed data.

In the third write step, the process in Step S14 is performed. FIG. 10 shows the state of the process in Step S14. As shown in FIG. 10, the row decoder 3 respectively applies the voltages VL and 0V to the select gate lines SGD and SGS, applies the program voltage VPGM to the selected word line WL29, applies the intermediate voltage VGP to the unselected word line WL28, applies the voltage of 0V to the unselected word line WL27, and applies the voltage VPASS to other unselected word lines WL0 to WL26 and WL30 and WL31. As a result, the channels are formed in the memory cell transistors MT connected to the word lines WL0 to WL26 and WL28 to WL31 except for the word line WL27.

In the NAND cell connected to the selected bit line BL0, the charges are injected into the charge accumulation layer 14 by a potential difference between the channel and the selected word line WL29 in the memory cell transistor MT29-0. That is the "0" program is executed.

In the NAND cell connected to the selected bit line BL2 and unselected bit line BL1, because the select gate line SGD has the potential VL while the bit lines BL1 and BL2 have the potential (Vdd+Vs), the selection transistors ST1 and ST2 are cut off. Therefore, the channel in the NAND cell becomes floating. The potential at the floating channel is boosted by the coupling to the word line. At this point, the memory cell transistors 27-1 and 27-2 connected to the word line WL27 are cut off. Accordingly, the channel potential at the memory cell transistor MT29-1 connected to the selected word line WL29 is increased by the self-boost in which the memory cell transistors MT30-1 and 31-1 are used, and the channel potential at the memory cell transistor MT29-2 is increased by the self-boost in which the memory cell transistors MT30-2 and 31-2 are used. Therefore, the charges are not injected into the charge accumulation layers 14 of the memory cell transistors MT29-1 and MT29-2, and the "1" program is performed to the memory cell transistor MT29-2.

The effect (1) is obtained in the NAND flash memory according to the first embodiment of the invention.

(1) Operation reliability can be improved in the NAND flash memory.

In the NAND flash memory of the first embodiment having the above-described configuration, the erroneous data write can be prevented in the memory cell transistor MT which connected to the selected word line and in which the data should not be written, and the operation reliability of the NAND flash memory can be improved. The effect (1) will be described below.

In the nonvolatile semiconductor memory typified by the NAND flash memory, a high electric field is applied between the gate and the channel to trap the charges in the charge accumulation layer, whereby the threshold voltage of the memory cell fluctuates to program the data.

At this point, in the NAND cell including the memory cell transistor MT in which the "1" program is executed, the selection transistors ST1 and ST2 are cut off to put the channel of the memory cell group into floating. The potential at the channel is increased by the coupling to the word line, thereby relaxing the electric field between the gate and the channel. Therefore, the charges are not trapped in the charge accumulation layer, and the "1" program is executed. The same holds true for the NAND cell connected to the unselected bit line. This is the conventional self-boost technique.

In the NAND flash memory, the data program is sequentially executed from the memory cell transistor MT located closer to the select gate line SGS. That is, the data program is sequentially executed from the memory cell transistor MT connected to the word line WL0. During the program of the memory cell transistors MT connected to the word lines WL0 or WL1, the boost efficiency is high because almost all the memory cell transistors MT included in the NAND cell are in the erase state. That is, the channel potential can efficiently be increased, which decreases a frequency that the "0" program is erroneously performed to the memory cell transistor MT in which the "1" program should be executed and the unselected memory cell transistor MT.

However, during the program of the memory cell transistors MT connected to the word lines WL30 or WL31 located close to the select gate line SGD, the data is already programmed in almost all the memory cell transistors MT included in the NAND cell. Accordingly, the boost efficiency is lowered to generate a risk of the erroneous "0" program. Obviously a technique of enhancing the voltage VPASS to sufficiently perform the boost can be adopted. In such cases, there is a risk of generating the erroneous write to the unselected memory cell transistor connected to the selected bit line.

In order to solve the problem, there is a technique in which the intermediate voltage VGP is applied to the unselected word line WLn-1 located closer to the select gate line SGS than the selected word line WLn while the voltage of 0V is applied to WLn-2. In the technique, the channels of the selected memory cell transistor and the unselected memory cell transistor located closer to the side of the select gate line SGD than the selected memory cell transistor are electrically separated from the channel of the memory cell transistor (memory cell transistor located closer to the select gate line SGS than the selected memory cell transistor) in which the data is already programmed. This enables the self-boost to be performed using only the memory cell transistor MT in the erase state to improve the boost efficiency.

However, even in such cases, sometimes it is difficult that the memory cell transistor MTn-2 connected to the unselected word line WLn-2 is surely cut off. That is, sometimes the threshold voltage is substantially equal to the erase state depending on the data retained by the memory cell transistor MTn-2. Even if the voltage of 0V is applied to the unselected word line WLn-2, the memory cell transistor MTn-2 is turned on, which causes lowering of the boost efficiency.

On the other hand, in the configuration of the first embodiment, the unselected memory cell transistor MTn-2 is cut off more securely, so that the self-boost can be performed to improve the boost efficiency using only the memory cell transistor MT in the erase state. As a result, the generation of the erroneous write can be prevented in the unselected memory cell transistor MT to improve the write reliability. The effect will be described below.

Figure 11:
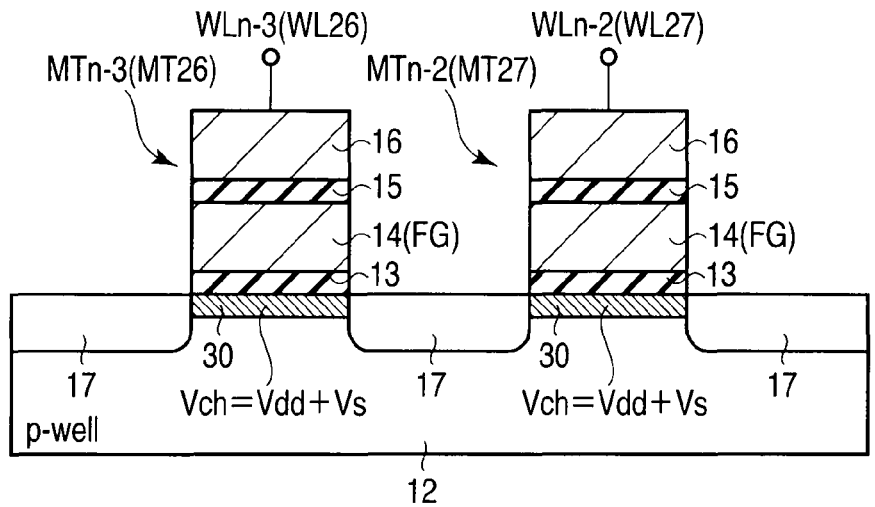
FIG. 11 is a sectional view showing a partial region of the memory cell array of the first embodiment.

In the case of the write operation of the first embodiment, in the second write step (Steps S12 and S13 of FIG. 6), the potential at the selected bit line BL in the floating state is increased by Vs by the coupling to the source line SL, the unselected bit line BL, and the well region 12. FIG. 11 shows the state of the increased potential at the selected bit line BL. FIG. 11 is a sectional view showing the memory cell transistors MTn-2 and MTn-3 connected to the unselected word lines WLn-2 and WLn-3 which is located closer to the select gate line SGS than the selected word line WLn. The memory cell transistors MTn-2 and MTn-3 of FIG. 11 correspond to the sectional view of the memory cell transistors MT26 and MT27 of FIG. 7. FIG. 11 shows the case in which the memory cell transistors MTn-2 and MTn-3 are not cut off when the voltage of 0V is applied to the word line WLn-2.

As shown in FIG. 11, in the case where the memory cell transistors MTn-2 and MTn-3 are not cut off, channel 30 are formed in the memory cell transistors MTn-2 and MTn-3. In the first embodiment, because the channel 30 has the potential Vch of (Vdd+Vs), the source region 17 of the memory cell transistor MTn-2 has the potential of (Vdd+Vs). Then, the self-boost is performed in the third write step. In FIG. 11, the voltage of 0V is applied to the word line WLn-2, and the voltage VPASS is applied to the word line WLn-3. Therefore, the channel potential Vch at the memory cell transistor MTn-3 is increased by the coupling to VPASS, and therefore the potential is increased in the source region 17 of the memory cell transistor MTn-2.

At this point, the channel potential at the memory cell transistor MTn-3 is increased from (Vdd+Vs) by the self-boost. That is, in performing the self-boost, the channel 30 has the initial potential (Vdd+Vs). In the case where the second write step is not performed, the channel 30 has the initial potential Vdd. Accordingly, compared with the case in which the second write step is not performed, the channel potential at the memory cell transistor MTn-3 can be enhanced by the self-boost, the gate-source voltage VGS is lowered at the memory cell transistor MTn-2 to easily cut off the memory cell transistor MTn-2, and the self-boost can be performed using only the memory cell transistor MT in the erase state.

The effect becomes more prominent in the multi-level NAND flash memory. As described in the background art, the securement of the retention margin becomes difficult in the multi-level NAND flash memory. However, in the configuration of the first embodiment, because the memory cell transistor MTn-2 is cut off in writing the data, the threshold distribution of the data can be expanded toward the negative voltage side as a whole. Accordingly, the retention margin can be secured while the operation reliability is ensured, and the conventional trade-off problem can be solved.

Second Embodiment

Figure 12:
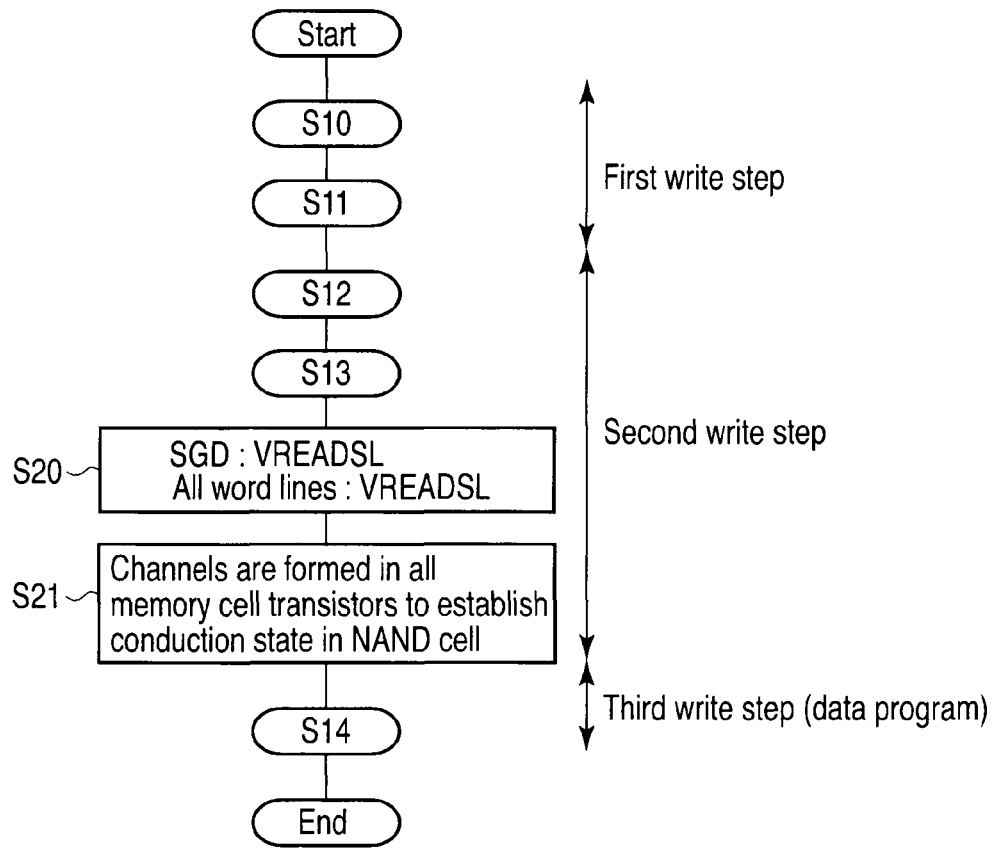
FIG. 12 is a flowchart showing a write operation according to a second embodiment of the invention.

A semiconductor memory device and a data write method thereof according to a second embodiment of the invention will be described below. In the second embodiment, in the second write step of the first embodiment, the conducting state is established in the memory cell transistor MT of the NAND cell. Because the NAND flash memory of the second embodiment has the configuration similar to that of the first embodiment, the description is omitted. FIG. 12 is a flowchart showing a data write operation of the second embodiment. Only the point different from the first embodiment will be described below.

As shown in FIG. 12, similarly to the first embodiment, the processes in Steps S10 and S11 are performed in the first write step. Then, the processes in Steps S12 and S13 are performed in the second write step. That is, the selected bit line BL is put into floating, and the potential at the floating selected bit line BL is increased by the coupling to the unselected bit line BL, the source line SL, and the p-type well region 12.

At this point, the row decoder 3 applies a voltage VREADSL to the select gate line SGD and all the word lines WL (Step S20). The voltage generation circuit 7 generates the voltage VREADSL. The voltage VREADSL enables the selection transistor ST1 to pass the voltage (Vdd+Vs), and the voltage VREADSL enables the memory cell transistor MT to be turned on irrespective of the retention data. Therefore, in all the NAND cells, all the memory cell transistors MT are turned on to form the channels, and all the selection transistors ST1 are turned on. That is, the conducting state is established in the channel of the memory cell group of the NAND cell, and the corresponding bit line BL is electrically connected (Step S21).

In the third write step, the process in Step S14 of the first embodiment is performed to program the data.

A specific example of the write operation of the second embodiment will be described below. It is assumed that the data program is performed on the condition described with reference to FIG. 7 like the first embodiment.

The memory block 9 becomes the state shown in FIG. 9 by the processes in Steps S10 to S13 of the first embodiment. Then, the process in Step S20 is performed. FIG. 13 shows the state of the process in Step S20. FIG. 13 is a circuit diagram of the memory block 9.

As shown in FIG. 13, the voltage VREADSL is applied to the select gate line SGD and all the word lines WL0 to WL31, and the selection transistors ST1-0 to ST1-2, the memory cell transistors MT0-0 to MT31-0, MT0-1 to MT31-1, and MT0-2 to MT31-2 are turned on. That is, the channels are formed in all the memory cell transistors MT in each NAND cell, and the channel potential Vch becomes equal to the potential at the corresponding bit line BL. In other words, the channel potential Vch at the NAND cell connected to the bit line BL0 is Vs, and the channel potential Vch at the NAND cell connected to the bit lines BL1 and BL2 is (Vdd+Vs). Then, the data program is performed as shown in FIG. 10 of the first embodiment.

In addition to the effect (1) of the first embodiment, the effect (2) is obtained in the NAND flash memory of the second embodiment.

(2) The operation reliability of the NAND type flash memory can further be improved (part 1).

In the data write method of the second embodiment, in the second write step, the voltage VREADSL is applied to all the select gate lines SGD and all the word lines WL to form the channels in all the memory cell transistors MT, and the channels are connected to the bit lines BL.

Therefore, the memory cell transistors MTn-2 and MTn-3 connected to the unselected word lines WLn-2 and WLn-3 are turned on without fail, and the channel potentials Vch at the memory cell transistors MTn-2 and MTn-3 become equal to the potential at the corresponding bit line BL. That is, the memory cell transistors MTn-2 and MTn-3 become the state of FIG. 11 without fail in the NAND cell in which the "1" program should be performed and the NAND cell connected to the unselected bit line. In other words, the initial potential of the self-boost in the memory cell transistor MTn-3 can surely be set at (Vdd+Vs) by performing the process in Step S20 irrespective of the data retained at that time. Accordingly, the memory cell transistor MTn-2 can be cut off more surely to improve the operation reliability of the NAND flash memory.

Third Embodiment

Figure 14:
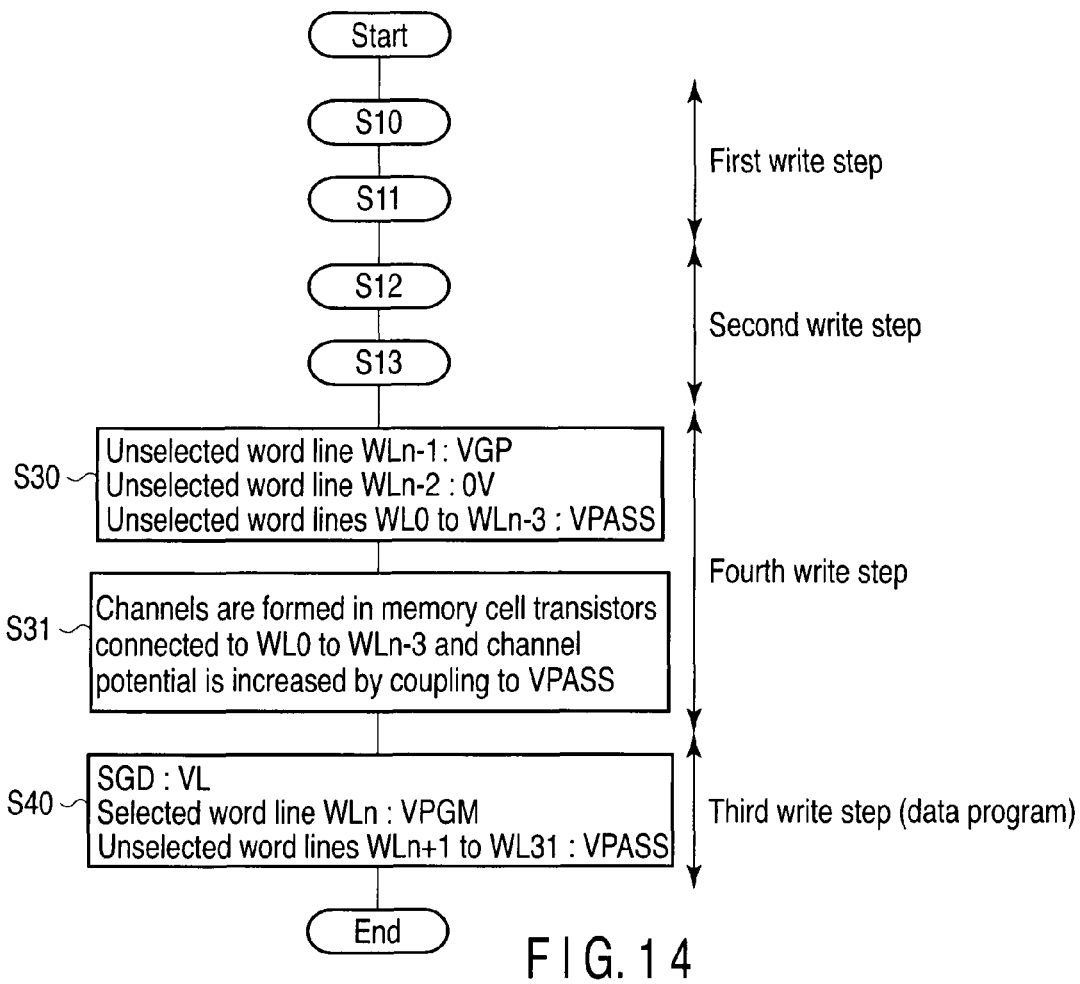
FIG. 14 is a flowchart showing a write operation according to a third embodiment of the invention.

A semiconductor memory device and a data write method thereof according to a third embodiment of the invention will be described below. In the third embodiment, the initial potential at the memory cell transistor located on the source side is increased by a method different from the second embodiment. Because the NAND flash memory of the third embodiment has the configuration similar to that of the first embodiment, the description is omitted. FIG. 14 is a flowchart showing a data write operation according to the third embodiment of the invention. Only the point different from the first embodiment will be described below.

As shown in FIG. 14, similarly to the first embodiment, the processes in Steps S10 and S11 are performed in the first write step. Then, the processes in Steps S12 and S13 are performed in the second write step. That is, the selected bit line BL is put into floating, and the potential at the floating selected bit line BL is increased by the coupling to the unselected bit line BL, the source line SL, and the well region 12.

In the third embodiment, a fourth write step is performed before the third write step. The row decoder 3 changes the voltage applied to the select gate line SGD from VH to VL. The row decoder 3 applies the voltage VGP to the unselected word line WLn-1, applies the voltage of 0V to the unselected word line WLn-2, and applies the voltage VPASS to the unselected word lines WL0 to WLn-3 (Step S30). The voltage applied to other word lines WL is not changed. The channels are formed in the memory cell transistors MT connected to the unselected word lines WL0 to WLn-3, and the channel potentials Vch at the memory cell transistors MT are substantially increased to VPASS by the coupling to the word line (Step S40).

Then, in the third write step, the process in Step S14 of the first embodiment is performed to program the data.

A specific example of the write operation of the third embodiment will be described below. It is assumed that the data program is performed on the condition described with reference to FIG. 7 like the first embodiment.

Figure 15:
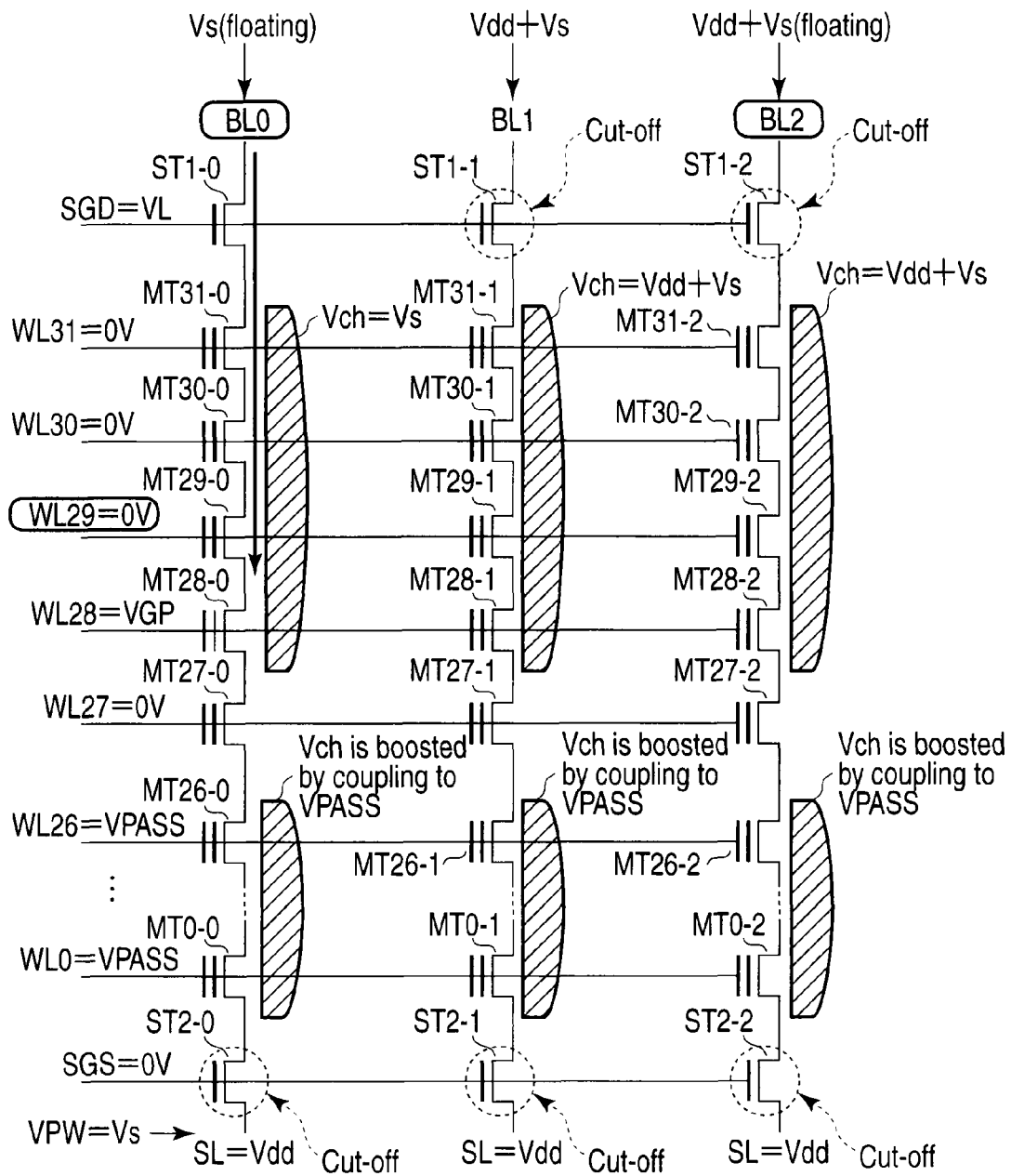
FIG. 15 is a circuit diagram showing a memory cell array of the third embodiment.

The memory block 9 becomes the state shown in FIG. 9 by the processes in Steps S10 to S13 of the first embodiment. Then, the process in Step S30 is performed. FIG. 15 shows the state of the process in Step S30. FIG. 15 is a circuit diagram of the memory block 9.

As shown in FIG. 15, the voltage VL is applied to the select gate line SGD to cut off the selection transistors ST1-1 and ST1-2. The selection transistor ST1-0 is maintained at the turn-on state. The voltage VGP is applied to the unselected word line WL28, the voltage of 0V is applied to the unselected word line WL27, and the voltage VPASS is applied to the unselected word lines WL0 to WL26. Therefore, the channels are formed in the memory cell transistors MT0 to MT26. The channel potential is increased by the coupling to the word lines WL0 to WL26. Then, the data program is performed as shown in FIG. 10 of the first embodiment.

In addition to the effect (1) of the first embodiment, the effect (3) is obtained in the NAND flash memory of the third embodiment.

(3) The operation reliability of the NAND type flash memory can further be improved (part 2).

In the data write method of the third embodiment, in the fourth write step after the second write step, the voltage VPASS is applied to the unselected word lines WL0 to WLn-3 located closer to the select gate line SGS than the selected word line WLn. That is, prior to the data program in the third write step, the self-boost is previously performed to the unselected word line located closer to the select gate line SGS than the selected word line.

Figure 16:
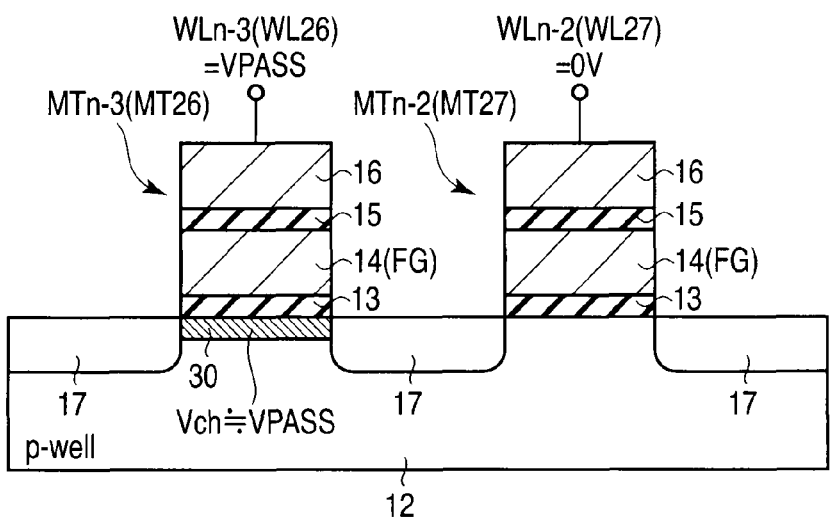
FIG. 16 is a sectional view showing a partial region of the memory cell array of the third embodiment.

Accordingly, because the source potential at the memory cell transistor MTn-2 is substantially increased to VPASS at the point in the third write step, the memory cell transistor MTn-2 can be cut off more securely. FIG. 16 shows the state of the increased source potential. FIG. 16 is a sectional view showing the memory cell transistors MTn-2 and MTn-3 connected to the unselected word lines WLn-2 and WLn-3. The memory cell transistors MTn-2 and MTn-3 of FIG. 16 correspond to the sectional view of the memory cell transistors MT26 and MT27 of FIG. 7.

As shown in FIG. 16, in the fourth write step, the channel 30 is formed in the memory cell transistor MTn-3, and the channel potential Vch at the memory cell transistor MTn-3 substantially is VPASS. That is, the source region 17 of the memory cell transistor MTn-2 substantially has the potential VPASS. The voltage of 0V is applied to the gate of the memory cell transistor MTn-2. Even if the memory cell transistor MTn-2 is in the erase state, the memory cell transistor MTn-2 can be cut off, so that the operation reliability of the NAND flash memory can be improved.

Thus, in the semiconductor memory devices according to the first to third embodiments of the invention, in the data write operation, the selected bit line is put into the floating state after the write voltage is applied to the selected bit line in which the "0" program is executed and the write inhibit voltage Vdd is applied to the unselected bit line and the selected bit line in which the "1" program is executed, while the selected transistor is turned on. Then, the voltage Vs is applied to the unselected bit line, the source line, and the p-type well region 12, whereby the potential at the selected bit line is increased by the coupling to the unselected bit line, the source line, and the well region 12. Then, while the potential at the selected bit line is increased by the coupling, the program voltage VPGM is applied to the selected word line and the self-boost is performed, thereby the data program is performed to the selected memory cell transistor MT. Accordingly, the initial potential at the channel of the unselected memory cell transistor MT is increased by the self-boost by Vs compared with the conventional technique, so that the cut-off characteristic can be improved in the memory cell transistor MTn-2 connected to the unselected word line WLn-2 which is located closer to the side of the select gate line SGS than the selected word line WL. Therefore, the boost efficiency can be enhanced to improve the operation reliability of the NAND flash memory.

In the second embodiment, prior to the application of the program voltage, the row decoder applies the voltage VREADSL to all the word lines in the NAND cell including the memory cell transistor in which the data is programmed, thereby turning on all the memory cell transistors in the NAND cell. This enables the voltage (Vdd+Vs) to be surely applied to the channel of the memory cell transistor MTn-3.

In the third embodiment, prior to the application of the program voltage, the row decoder applies the voltage VPASS to the unselected word line connected to the memory cell transistor which is located closer to the source side than the selected memory cell transistor. That is, prior to the memory cell transistor located on the drain side, the self-boost is performed to the memory cell transistor located closer to the source side than the selected memory cell transistor. Therefore, the potential at the channel of the memory cell transistor MTn-3 can surely be increased.

In the embodiments, the data program is performed in units of even bit line or units of odd bit line. However, the way for dividing the bit line is not limited to the even number and odd number, but the program may be performed to each part of all the bit lines. The data may collectively be written for all the bit lines. That is, the data may collectively be programmed for all the memory cell transistors connected to the same word line. In such cases, in Step S12, the selected bit line is increased by the coupling to the source line SL and the p-type well region 12.

In the embodiments, the voltage Vs is applied to the unselected bit line, the source line SL, and the p-type well region 12 in Step S12. Alternatively, the different voltages may be applied to the source line SL and the well region 12. It is not necessary to apply the voltage Vs to all the unselected bit line, the source line SL, and the well region 12. That is, the voltage Vs may be applied to some of them. For example, the voltage Vs may be applied only to the well region 12. At the same time, from the viewpoint of efficient increase in potential at the selected bit line, desirably the voltage Vs is applied to the source line SL and the well region 12.

In the embodiments, the memory cell transistor MTn-2 connected to the word line WLn-2 is cut off during the data program. However, it is only necessary to cut off not only the memory cell transistor MTn-2 but the memory cell transistor MT located closer to the source side than the memory cell transistor MTn connected to the selected word line WLn. That is, the memory cell transistors MTn-1, MTn-3, and MTn-4 may be cut off. In the third embodiment, for example, when the memory cell transistor MTn-1 is cut off, the voltage VPASS is applied to the word lines WL0 to WLn-2. When the memory cell transistor MTn-3 is cut off, the voltage VPASS is applied to the word lines WL0 to WLn-4.

Although Step S10 and Step S11 in the first write step are individually described in the embodiments, obviously Step S10 and Step S11 may simultaneously be performed. Steps S12 to S21 of the second embodiment may simultaneously be performed. Desirably the program voltage VPGM and voltage VPASS used in the embodiments are boosted by Vs compared with those of the conventional use.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   memory cell transistors which are formed on a semiconductor layer, each of the memory cell transistors having a stacked gate including a charge accumulation layer and a control gate, the memory cell transistors being capable of retaining "0" data or "1" data based on whether or not a charge is injected into the charge accumulation layer;
   a memory cell group in which current passages of the memory cell transistors are connected in series;
   a selection transistor which has a current passage connected in series to one of the memory cell transistors located closest to a drain side in the memory cell group;
   a memory cell array in which the memory cell group and the selection transistor are arranged;
   a bit line which is connected to a drain of the memory cell transistor through the current passage of the selection transistor;
   a page buffer which is adopted to apply a first voltage to the bit line connected to the memory cell transistor in which the "0" data is to be programmed and apply a second voltage larger than the first voltage to the bit line connected to the memory cell transistor in which the "1" data is to be programmed, when the selection transistor is turned on, in a write operation of the data, the page buffer being adopted to put the bit line into electrically floating state after the first voltage and the second voltage are applied;
   a word line which is connected to the control gate of the memory cell transistor; and
   a row decoder which is adopted to apply a positive third voltage to the semiconductor layer, select the word line connected to the memory cell transistor to be programmed, and apply a program voltage to the selected word line when the bit line is in the electrically floating state.

2. The device according to claim 1, wherein the row decoder cuts off the memory cell transistor located closer to a source side than the memory cell transistor in which the data is programmed before the program voltage is applied.

3. The device according to claim 1, wherein the page buffer selects the bit lines in the write operation,
   the data is collectively written to the memory cell transistors connected to the selected bit lines, and
   the page buffer applies a fourth voltage to an unselected bit line while applying the first voltage and the second voltage to the selected bit line in the write operation of the data.

4. The device according to claim 3, wherein the page buffer puts the selected bit line into the electrically floating state, and
   the page buffer applies a fifth voltage larger than the fourth voltage to the unselected bit line.

5. The device according to claim 4, wherein a potential at the selected bit line is increased by coupling to the semiconductor layer and the unselected bit line.

6. The device according to claim 1, wherein when the program voltage is applied to the word line,
   the row decoder turns on the selection transistor connected to the bit line to which the first voltage is applied and turns off the selection transistor connected to the bit line to which the second voltage is applied, and
   the row decoder applies the fourth voltage smaller than the program voltage to an unselected word line to turn on the memory cell transistor connected to the unselected word line.

7. The device according to claim 6, wherein the row decoder applies the fourth voltage to an unselected word line located on the drain side after applying the fourth voltage to the unselected word line located closer to a source side than the selected word line.

8. The device according to claim 1, wherein before the program voltage is applied,
   the row decoder turns on all the memory cell transistors in the memory cell group including the memory cell transistor to be programmed by applying a fourth voltage to all the word lines.

9. A data write method of a NAND flash memory comprising:
   applying a first voltage to a first bit line connected to a memory cell transistor in which "0" data is to be programmed when a selection transistor is turned on;
   applying a second voltage larger than the first voltage to a second bit line connected to a memory cell transistor in which "1" data is to be programmed when the selection transistor is turned on;

putting the first bit line and the second bit line into electrically floating state after the first voltage and the second voltage are applied;

increasing a potential at a semiconductor layer by applying a third voltage to the semiconductor layer on which the memory cell transistor is formed after the first voltage and the second voltage are applied; and programming data to the memory cell transistor by selecting a word line and applying a program voltage to the selected word line in a state that potentials at the first bit line and the second bit line are put into floating and a potential at the semiconductor layer is increased.

10. The method according to claim 9, wherein a memory cell transistor located closer to a source side than the memory cell transistor connected to the selected word line is cut off when the data is programmed.

11. The method according to claim 9, further comprising applying a fourth voltage to a third bit line which is not connected to the memory cell transistor to be programmed, when the selection transistor is turned on.

12. The method according to claim 11, further comprising applying a fifth voltage larger than the fourth voltage to the third bit line after the first, second, and fourth voltages are applied.

13. The method according to claim 12, wherein a potential at the selected bit line is increased by coupling to the semiconductor layer and the unselected bit line.

14. The method according to claim 9, further comprising:
turning on the selection transistor connected to the first bit line and turning off the selection transistor connected to the second bit line; and applying a fourth voltage smaller than the program voltage to an unselected word line to turn on the memory cell transistor connected to the unselected word line, wherein the data is programmed in a state that the selection transistors connected to the first and second bit lines are respectively turned on and off and the fourth voltage is applied to the unselected word line.

15. The method according to claim 9, further comprising turning on all the memory cell transistors in the memory cell group including the memory cell transistor to be programmed by applying a fourth voltage to all the word lines after the first and second bit lines are put into floating state.

16. The method according to claim 14, wherein, the fourth voltage is applied to an unselected word line located closer to a drain side than the selected word line after applying to an unselected word line located closer to a source side than the selected word line.

* * * * *